United States Patent [19]

Beno et al.

[11] 4,254,327

[45] Mar. 3, 1981

[54] PULSE GENERATOR HAVING SELECTABLE PULSE WIDTH AND PULSE REPETITION INTERVAL

[75] Inventors: Lawrence A. Beno, Camarillo; John T. Harrell, Newbury Park; Albert B. Evans, Jr., Ventura; Jay R. Gaudig, Camarillo, all of Calif.

[73] Assignee: The United States of America as represented by the Secretary of the Navy, Washington, D.C.

[21] Appl. No.: 40,014

[22] Filed: May 17, 1979

Related U.S. Application Data

[62] Division of Ser. No. 875,831, Feb. 7, 1978, Pat. No. 4,163,234.

[51] Int. Cl.³ .............................................. H03K 21/36
[52] U.S. Cl. .......................... 235/92 CC; 235/92 PE; 235/92 DE; 235/92 EC
[58] Field of Search ......... 235/92 CC, 92 PE, 92 DP, 235/92 PB, 92 DE, 92 EC; 328/58, 59, 60

[56] References Cited

U.S. PATENT DOCUMENTS

| | | | |
|---|---|---|---|
| 3,581,066 | 5/1971 | Maure et al. | 235/92 DE |
| 3,824,378 | 7/1974 | Johnson et al. | 235/92 CC |
| 3,981,440 | 9/1976 | Richardson | 235/92 CC |
| 4,165,490 | 8/1979 | Howe et al. | 328/60 |

Primary Examiner—Joseph M. Thesz
Attorney, Agent, or Firm—Richard S. Sciascia; Joseph M. St. Amand; William C. Daubenspeck

[57] ABSTRACT

Apparatus for generating pulses having selectable pulse width and selectable pulse repetition interval which may be used as a pulse repetition interval generator in a radar signal simulator. Each pulse is initiated by a clocked counter when it reaches a predetermined count from a preselected initial count. The initial count is determined by data stored in a read-only-memory which is selectably loaded into the counter to provide a variable initial count. Another clocked counter which is enabled by the leading edge of the pulse then terminates the pulse when it reaches a predetermined count from a preselected initial count.

9 Claims, 5 Drawing Figures

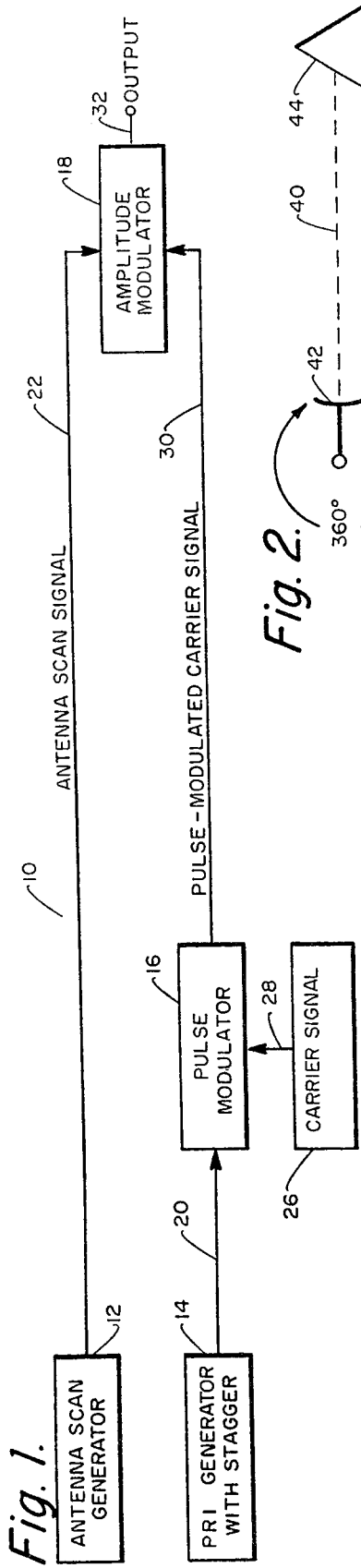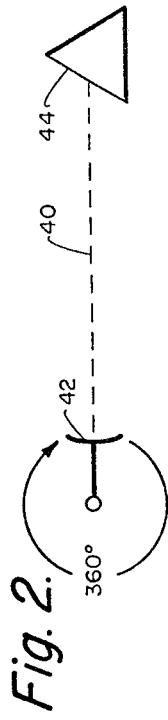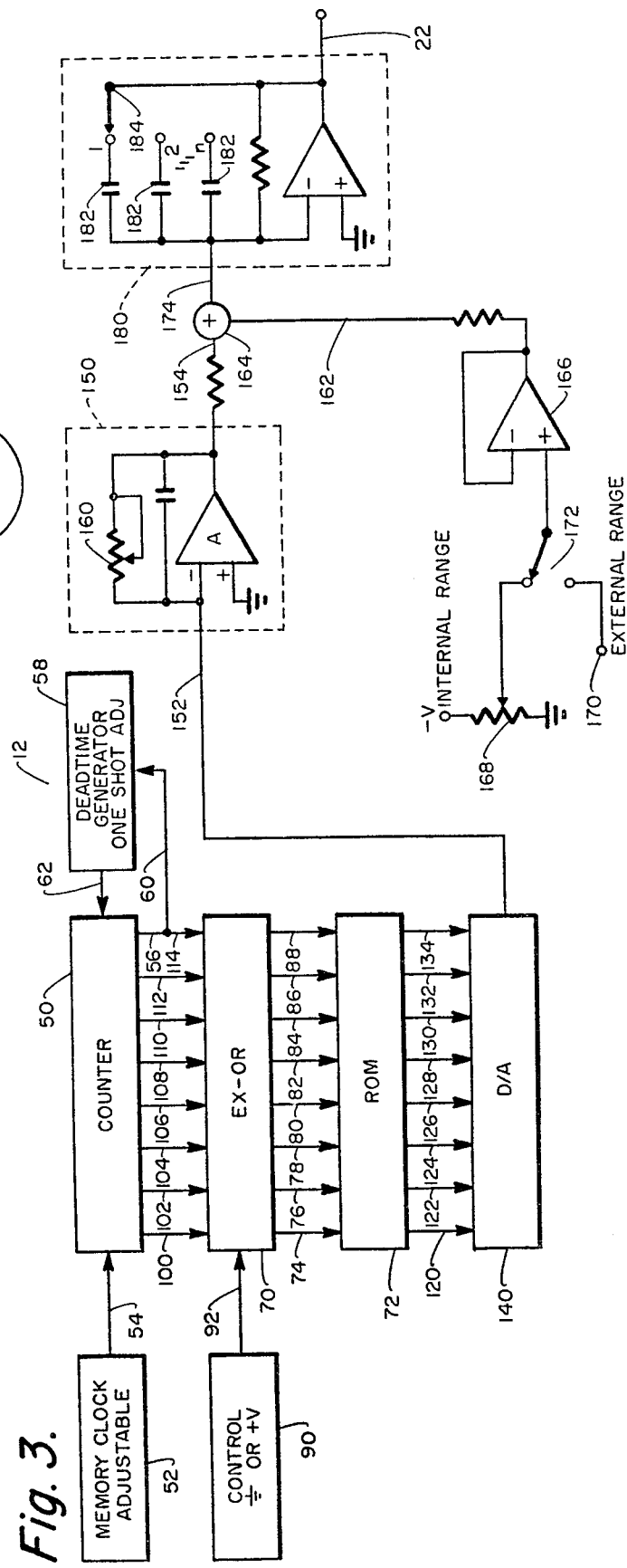

PULSE GENERATOR HAVING SELECTABLE PULSE WIDTH AND PULSE REPETITION INTERVAL

This is a division of application Ser. No. 875,831 filed Feb. 7, 1978, now U.S. Pat. No. 4,163,234.

BACKGROUND OF THE INVENTION

1. Field of the Invention

The present invention relates generally to a digital electronic apparatus for generating simulated scan patterns of a conventional radar antenna.

2. Description of the Prior Art

Radar systems normally employ directive antennas for transmission and reception and the gain of these antennas is a function of the angular distance of the target from the axis of maximum sensitivity of the antenna. In practice, the target will be on the axis of maximum antenna gain for only a short period of time, and as the antenna scans past the target the amplitude of the radiated pulses as seen by the target will be modulated by the shape of the antenna gain pattern.

The problem of generating a series of pulses whose amplitude varies according to a particular antenna pattern has been solved by prior art devices utilizing electromechanical techniques. These electromechanical devices have significant drawbacks that are inherent in their modes of operation. Most such devices include a motor driving a shaped potentiometer. These devices are expensive, subject to wear on the movable parts and are able to generate only one pattern shape.

SUMMARY OF THE INVENTION

The present invention overcomes the disadvantage and limitations of the prior art by providing an improved radar antenna scan pattern simulator. The present invention utilizes an antenna scan generator for providing a low frequency a-c signal and a pulse repetition interval generator with stagger circuit for providing a pulse repetition interval signal. An RF carrier signal modulated by the pulse repetition interval signal is amplitude modulated by the low frequency a-c signal for generating the simulated antenna scan pattern.

It is therefore an object of the present invention to provide an improved radar antenna scan pattern simulator.

Another object of the present invention is to provide an antenna scan pattern simulator that is reliable in operation and inexpensive to manufacture. Still another object of the present invention is to provide an antenna scan pattern simulator that is programmable.

Other objects and further scope of applicability of the present invention will become apparent in the detailed description given hereinafter. The detailed description indicates the preferred embodiments of the invention and is given by way of illustration only since various changes and modifications within the spirit and scope of the invention will become apparent to those skilled in the art from this detailed description when considered in connection with the accompanying drawings in which like reference numerals designated like parts throughout the figures thereof and wherein.

It should be understood that the foregoing abstract of the disclosure is for the purpose of providing a nonlegal brief statement to serve as a search scanning tool for scientists, engineers and researchers and is not intended to limit the scope of the invention as disclosed herein nor is it intended that it should be used in interpretting or any way limiting the scope or fair meaning of the appended claims.

BRIEF DESCRIPTION OF THE DRAWINGS

FIG. 1 is a block diagram illustrating the operation of the preferred embodiment of the invention.

FIG. 2 illustrates the system which the circuit of FIG. 1 simulates.

FIG. 3 is a schematic drawing illustrating the antenna scan generator block of the embodiment shown in FIG. 1.

DESCRIPTION OF THE PREFERRED EMBODIMENT

Figure 4:
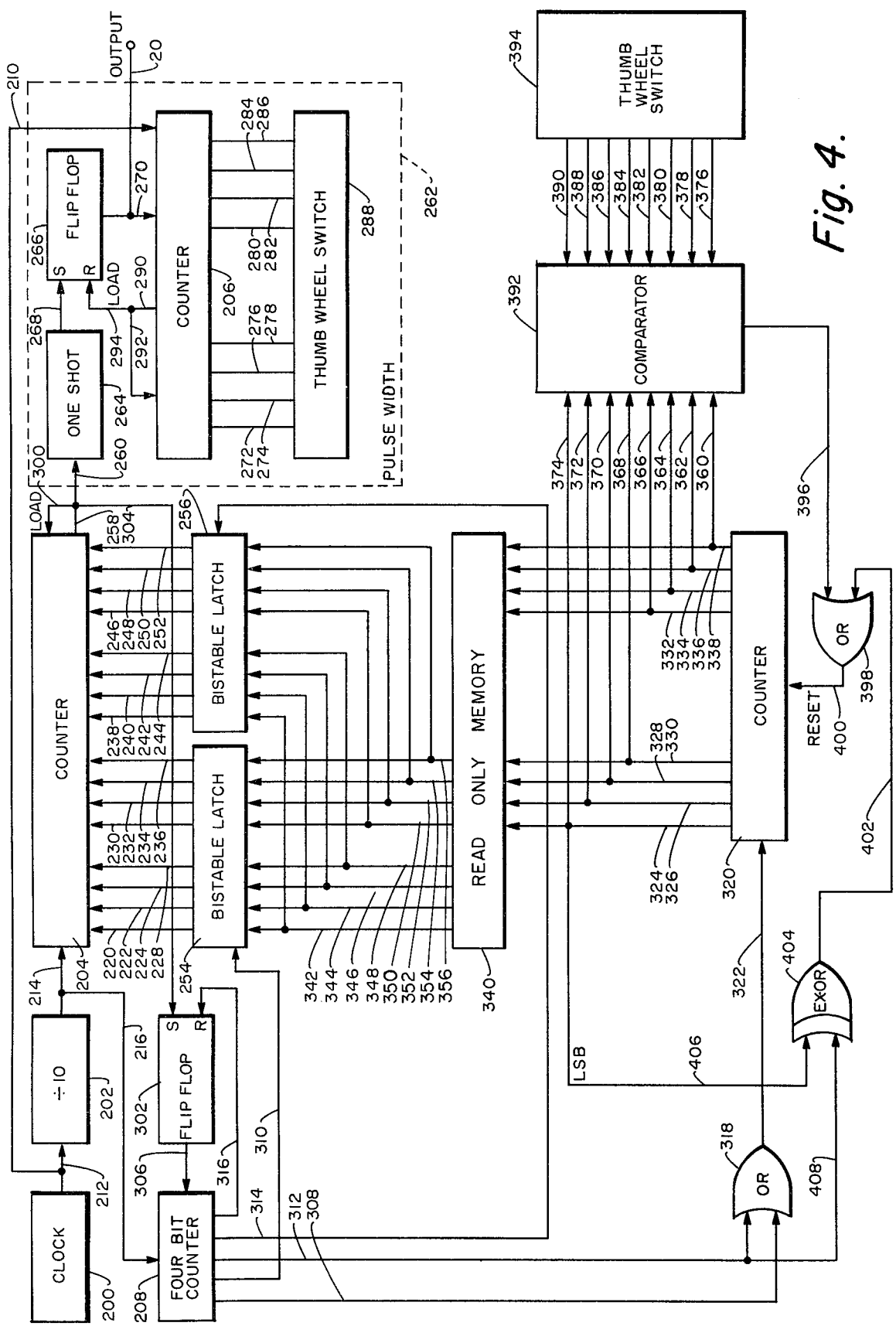
FIG. 4 is a schematic diagram illustrating the PRI-generator-with-stagger block of the embodiment illustrated in FIG. 1.

The digital radar signal simulator 10 illustrated in the drawings and described hereinafter as an examplary embodiment of the present invention comprises, as shown in FIG. 1, at least one antenna-scan-generator 12, at least one PRI-generator-with-stagger circuit 14, at least one pulse modulator 16, and at least one amplitude modulator 18.

As shown in FIG. 2, the signal appearing on line 32 of FIG. 1 is a simulation of a radar antenna output as seen by a target 44 located along a single radial 40 as antenna 42 scans through a full 360° azimuth. As antenna 42, turning about its axis, begins to illuminate target 44, small amplitude pulses are received by target 44. The amplitude of the pulses increases until antenna 42 centers on radial 40 at which time the amplitude of the pulses received by target 44 are at a maximum. Then the pulses received by target 44 decrease in amplitude as antenna 42 moves past radial 40 until at some point, target 44 no longer receives the pulses. This cycle is repeated once each time antenna 42 scans through a full 360° azimuth.

Returning to FIG. 1, the effect of small amplitude pulses gradually increasing in amplitude to a maximum amplitude and then gradually decreasing in amplitude to zero as antenna 42 passes through radial 40 is simulated by modulating the signal on line 30 which is a RF carrier signal modulated by a series of pulses by the signal on line 22 which is a low frequency AC signal.

The pulses emitted by a radar antenna such as 42 of FIG. 2 are simulated by modulating the carrier signal on line 28 with the pulse repetition interval signal on line 20. The signal along radial 40 of FIG. 2 as seen by a target such as 44 is simulated on line 32 by modulating the pulse modulated carrier signal on line 30 by the low frequency AC signal on line 22.

Now turning to FIG. 3, antenna scan generator 12 is shown in greater detail. Antenna scan generator 12 generates a low frequency a-c signal on line 22. Eight bit counter 50 is driven by memory clock 52 via line 54. Counter 50 counts upwards from zero to 128. After counter 50 has counted to 128, a pulse appears on line 56 which is coupled to dead-time generator 58 via line 60.

Dead-time generator 58 is a monostable multivibrator having an adjustable time period. The output of dead-time generator 58 appearing on line 62 and directed to counter 50 resets and inhibits counter 50 from counting during the time period of dead-time generator 58. Returning to FIG. 2, dead-time generator 58 inhibits counter 50 from counting during a specific time period thereby simulating that portion of the signal on line 22 during the time that antenna 42 is not illuminating target 44.

Read only memory 72 contains 256 eight bit words. Each word is a digital representation of a discrete portion of an antenna scan pattern. In the embodiment shown in FIG. 3, two antenna scan patterns are stored in memory 72. A conical-scan-pattern is stored in memory locations 0 to 128 and a track-while-scan or search-pattern is stored in locations 255 to 128. The control signal from control 90 entering exclusive-or-circuit 70 via line 92 determines which scan pattern will be generated. When the signal on line 92 is at ground level potential, read only memory 72 is addressed sequentially from 0 to 128, thereby generating the conical-scan-pattern stored in memory location 0 to 128.

Conversely, when the control signal on line 92 is at +V, a predetermined DC level, the data entering exclusive-or-circuit 70 on lines 100 through 114 appear inverted on lines 74 through 88, thereby generating the track-while-scan or search-pattern stored in memory locations 255 to 128. For example, a 1 appearing on line 108 would appear as a 0 on line 82 while a 0 appearing on line 110 would appear as a 1 on line 84, etc. Thus, when the control signal on line 92 is at a positive DC level (+V) the read only memory 72 is sequentially addressed from 256 down to 128 with the track-while-scan or search-pattern being generated.

Read only memory 72 generates a data word on lines 120 through 134 each time counter 50 is incremented by 1. This data word is coupled to digital-to-analog converter 140 via lines 120–134. The analog signal appearing on line 152 changes in amplitude each time counter 50 is incremented.

Modulation amplifier 150 adjusts the depth of modulation for the generated pattern and converts the current output on line 152 to a voltage signal on line 154. Potentiometer 160 is utilized to adjust the depth of modulation, i.e., the gain of modulation amplifier 150.

The modulation signal on line 154 is added to a range information signal on line 162 at summing junction 164. Range information signal 162 is a DC signal which is generated from an internal range potentiometer 168 or from an external range input 170. Manual switch 172 selects between internal range potentiometer 168 and the external range 170. The DC signal selected by switch 172 is buffered by buffer amplifier 166 and coupled to summing junction 164 via line 162. The modulation signal on line 154 is a negative voltage and the range information signal on line 162 is a negative voltage. The summed range information signal and modulation signal on line 174 is coupled to amplifying circuit 180. The greater the distance from target 44 to antenna 42 the smaller the amplitude of the range information signal on line 162.

Amplifier circuit 180 serves as an inverting amplifier for the signal on line 174 as well as a low pass filter. The filter component of amplifier circuit 180 is adjustable through manual switch 184 switching into the feedback circuit of amplifier filter 180, one of a plurality of capacitances 182. Each capacitor 182 exhibits a different value of capacitance thereby varying the cutoff frequency of filter 180. The output of amplifier circuit 180-a low frequency AC signal-appears on line 22 and is coupled to amplitude modulator 18 of FIG. 1.

As shown in FIG. 1 in response to the modulated range signal on line 22, amplitude modulator 18 attenuates the carrier signal on line 30, thereby simulating distance or range of target 44 from antenna 42 as well as providing the antenna scan pattern.

As noted supra, memory clock 52 is adjustable in frequency thereby resulting in memory words on lines 120 through 134 being fed to D-to-A converter 140 at different rates corresponding to the desired antenna rotation rate. The dead time generator or adjustable one shot 58 is enabled by the carry out pulse from line 56. The dead time generator upon receiving the carry out pulse on line 60 generates a control signal on line 62 which is coupled to counter 50 thereby preventing counter 50 from counting and resetting counter 50 to zero. The length of dead time is determined by the antenna rotation rate. When counter 50 is prevented from counting and reset to zero, the last word read out of memory 72 is presented to D-to-A converter 140 thus resulting in a modulation output signal on line 186 remaining at a constant DC voltage. This constant DC voltage appearing on line 22 during dead time drives amplitude modulator 18 such that a constant level of pulses having a low amplitude appears on line 32. Of course, at the end of the dead time or the period of the one shot 58, the counter 50 resumes counting thereby selecting words from the read only memory 52 resulting in a continuous repetition of the selected antenna scan pattern.

Now turning to FIG. 4, one embodiment of PRI generator-with-stagger 14 of FIG. 1 is illustrated in a schematic diagram. Clock 200 generates a clock signal which is coupled to counter 206 via line 210 and to divide-by-10 circuit 202 via line 212. Divide-by-10 circuit 202 divides the frequency of the clock signal on line 202 by ten and couples the divided signal to counter 204 via line 214 and to counter 204 via line 216.

Counter 204 counts the pulses from the signal on line 214 starting from a predetermined count which is determined by the digital signal on lines 220 through 252 from bistable latches 254, and 256. Whenever counter 204 reaches its limit or fills, it emits a pulse on line 258.

The pulse on line 258 is coupled to one-shot 264 of pulse width circuit 262 via line 260. Upon receiving a pulse on line 260, one-shot 264 is triggered thereby setting flip flop 266 via line 268. When set, flip flop 266 enables counter 206 via line 270 causing counter 206 to count the pulses from clock 200 via line 210. Counter 206 counts upwards from a predetermined count which is set by the digital signal appearing on lines 272 through 286 from thumb wheel switch 288.

When filled, counter 206 emits a pulse on line 290 which is coupled back to counter 206 via line 292 and to R-S flip flop 266 via line 294. The signal on line 292 causes the counter 206 to load the digital signal on lines 272 through 286 into counter 206. The pulse on line 294 also resets the flip flop 266 thereby disabling counter 206 via line 270.

Line 20 is the output of PRI generator-with-stagger 14. Thus, the pulse width circuit 262 determines the width of the output appearing on line 298. When set, R-S flip flop causes the signal on line 298 to go high and remain in that state until R-S flip flop 266 is reset thereby causing the signal on line 20 to go low thereby generating a pulse each time one-shot 274 is triggered on line 260.

Once counter 204 fills, the pulse on line 258 is coupled back to counter 204 via line 300. The pulse on line 300 causes counter 204 to load the digital signal appearing on lines 220 through 252 into counter 204.

At the same time, the pulse on line 258 is coupled to R-S flip flop 302 via line 304, thereby setting flip flop 302 whose output is coupled to four bit counter 208 via 306, thereby enabling counter 208 to count the pulses entering counter 208 on line 216. The lines 308 through 314 represent the four bit output of counter 208 with line 316 representing the carry over output from counter 208. The first pulse entering counter 208 on line 216 causes an output pulse on line 308 which is coupled through OR gate 318 to counter 320 via line 322. The pulse on line 322 increments counter 320 by one.

The eight bit binary output on lines 324 through 338 are coupled directly to read-only-memory 340. The eight bit binary signal on lines 324 through 338 serve to address read-only-memory 340. Thus, the contents of the memory address location represented by the eight bit digital word on lines 324 through 338 is coupled via lines 342 through 356 to bistable latches 254 and 256.

Upon receiving the second pulse on line 216, four bit counter 208 outputs a pulse on line 310 which enables bistable latch 254 to load the contents of the bits on lines 342 through 356 thereinto.

Upon receiving the third pulse on line 216, counter 208 outputs a pulse only on line 312 which is coupled through OR gate 318 to increment counter 320 via line 322.

Upon receiving the fourth pulse on line 216, four bit counter 208 generates a pulse only on line 314 which is coupled to bistable latch 256 thereby causing bistable latch 256 to load the contents of the memory address location on lines 324 through 338 into bistable latch 256 via lines 342 through 356.

Upon receiving the fifth pulse on line 216 four bit counter 208 outputs a pulse only on line 316 which is coupled to R-S flip flop 302 thereby resetting R-S flip flop 302. When reset, R-S flip flop resets to zero and disables four bit counter 208 via line 306. Thus, each time a pulse is emitted from counter 204 onto line 258 bistable latch 254 is loaded with the data contained in a memory address location within read-only-memory 340. Then bistable latch 256 is loaded with the contents of the next memory address location to be addressed from read-only-memory 340. By sequentially loading bistable latches 254 and 256 from read-only-memory 340, only one read-only-memory 340 is required.

The output from counter 320 on lines 324 through 338 is coupled to comparator 392 via lines 360 through 374. Comparator 392 digitally compares the output of counters 320 with the output of thumb wheel switch 394 on lines 376 through 390. When the output of counter 320 is identical with the output of thumb wheel switch 394, comparator 392 outputs a pulse on to line 396 which is coupled through OR gate 398 to reset counter 320 to zero via line 400. Thumb wheel switches 394 are manually set such that the digital signal represented by the outputs on lines 376 through 390 correspond to the last memory address location desired to be read out of read-only-memory 340. Thus, once the desired sequence of pulses has been generated then counter 320 is reset and the sequence begins anew.

Exclusive OR circuit 404 comprises an error prevention mechanism. If initially, four bit counter 208 is not set to zero, then a pulse will appear on line 312 while the least significant bit from counter 320 on line 406 is 0 which would result in counter 320 being incremented by 1 twice during the time it should be incremented by 1 only once. Thus, if there is no 1 appearing on line 324 (the least significant bit of counter 320) while a 1 pulse appears on line 312 from four bit counter 208 a pulse is outputted from exclusive OR gate 404 to OR gate 398 via line 302 which resets counter 320 back to zero via line 400. R-S flip flop 302 subsequently resets four bit counter 208 to zero such that the next pulse received by R-S flip flop 302 on line 304 will enable four bit counter 208 and reset four bit counter 208 back to zero on lines 308 through 316.

Thus, the information stored in the memory address locations of read-only-memory 340 determine the time between pulses generated on line 20, while pulse width circuit 262 determines the width of the pulses generated on line 20. Comparator 392 and thumb wheel switches 394 determine the number of pulses per sequence generated on line 20.

Figure 5:
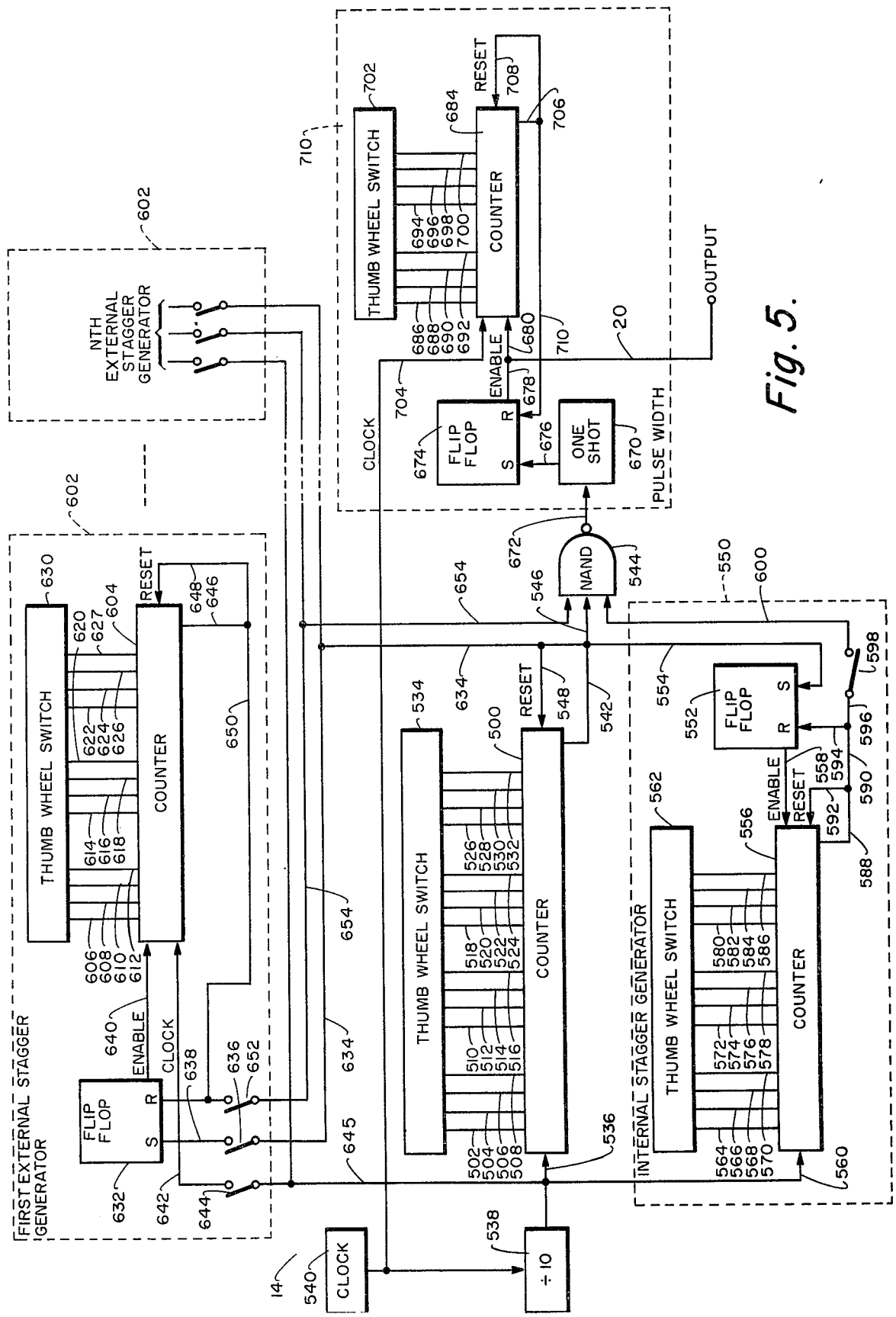
FIG. 5 is a schematic diagram illustrating another embodiment of the PRI-generator-with-stagger block of the embodiment illustrated in FIG. 1.

Now turning to FIG. 5, an alternate embodiment of the PRI generator-with-stagger 14 of FIG. 1 is illustrated. Digital counter 500 is preset by thumb wheel switches 534 with a high or low level signal appearing on each of lines 502 through 532. A clock signal on line 536 is coupled to counter 500 from divide-by-ten circuit 538. Clock 540 generates a clock signal which is coupled to divide-by-ten circuit 538 whereby the clock signal entering divide-by-ten circuit 538 is divided in frequency by 10 and coupled to counter 500 via line 536.

Counter 500 begins counting upwards from its preset condition and once filled generates a pulse on line 542 which inputs NAND gate 544 via line 546. The pulse on line 542 is also coupled to counter 500 via line 548 to load counter 500 back to its preset condition.

The pulse on line 542, in addition, is coupled to R-S flip flop 552 of internal stagger generator 550 via line 554. When R-S flip flop 552 receives a pulse on line 554 into its set input an enable signal is coupled to counter 556 via line 558. The enable signal when received on line 558 by counter 556 enables counter 556 to count upwards from its preset condition the clock pulse on line 560. Counter 556 is preset by thumb wheel switches 562 via lines 564 through 586. The carry output is coupled via lines 588, 590 and 594 to the reset input of R-S flip flop 552 which resets flip flop 552 thereby removing the enable signal from counter 556 which prohibits counter 556 from counting the incoming clock pulses on line 560.

The carry pulse on line 588 is also coupled to counter 556 via line 592 to load counter 556 to its preset condition. In addition, the carry pulse is coupled to NAND gate 544 through switch 598 and lines 590, 596 and 600.

First external stagger generator 602 is comprised of thumb wheel switches 630, counter 604 and R-S flip flop 632. The carry pulse from counter 500 on line 542 is coupled to the set input of R-S flip flop 632 of first external stagger generator 602 via lines 634 and 638 through switch 636. The carry pulse from counter 500 sets flip flop 632 such that an enable signal is coupled from flip flop 632 to counter 604 via line 640. This enable signal enables counter 604 to count upwards from its preset condition the clock pulses entering counter 604 via line 642, switch 644 and line 646 from divide-by-ten circuit 538.

The carry output on line 646 is coupled back into the reset input of counter 604 via line 648. The carry output on 646 is also coupled to the reset input of R-S flip flop 632 via line 650. Thus, when the carry pulse appears on line 646, counter 604 is reset to its preset condition and R-S flip flop 632 is reset thereby removing the enable signal from line 640 which prohibits the counter from counting the clock pulses on line 642. The carry pulse on line 646 is also coupled to NAND gate 544 via lines 650, 654 and switch 652.

As is shown in FIG. 5, there are N external stagger generator circuits 602 identical to the first external stagger generator circuit 602. Thus, up to N pulses may be generated to input NAND gate 544 via line 654, for each single pulse generated by counter 500 on line 542.

If a carry pulse appears either on line 654, line 546 or line 600 to NAND gate 544, NAND gate 544 triggers one shot 670 via line 672. The output of one shot 670 is coupled to the set input of R-S flip flop 674. Upon being set, R-S flip flop 674 outputs an enable signal on line 678. The enable signal on line 678 coupled via line 680 to counter 684 enables counter 684 to count the clock pulses coupled to counter 684 from clock 540 via line 704 from its preset condition upwards.

Counter 584 is preset by thumb wheel switches 702 via lines 686 through 700. The carry output 706 is coupled to the reset input of counter 684 via line 708 and to the reset input of R-S flip flop 674 via line 710. Thus, when a pulse appears on the carry output 706 of counter 684, it loads counter 684 back to its predetermined count and resets R-S flip flop 674 thereby removing the enable signal on line 680 which prohibits counter 684 from counting the clock pulses on line 704. The output of R-S flip flop 674 is the output of the PRI generator with stagger circuit 14 shown as line 682.

Thus, any pulse entering NAND gate 554 on lines 654, 546 or 600 triggers a pulse on output line 682 the width of which is determined by pulse width circuit 710.

It will be appreciated by those having average skill in the art that the complete circuit diagrams of FIGS. 3 through 5 include such suitable and necessary biasing voltage sources as are customarily provided in such circuits. All such biasing is not shown in FIGS. 3 through 5.

Obviously, numerous modifications and variations of the present invention are possible in light of the above teachings. It is therefore to be understood that within the scope of the appended claims the invention may be practiced otherwise than as specifically described herein.

What is claimed is:

1. Apparatus for generating pulses having selectable pulse width and selectable pulse repetition interval, comprising:
   a. means for generating a clock signal;
   b. means responsive to a first control pulse for generating an output pulse of a selectable pulse width, said means for generating an output pulse including,
      (1) first flip-flop coupled to respond to said first control pulse, the output of said first flip-flop being set to a first state in response to said first control pulse,
      (2) a first counter circuit coupled to the output of said first flip-flop and said means for generating a clock signal, said first counter circuit being enabled by the output of said first flip-flop in response to said first control pulse to count said clock signal;
      (3) means coupled to said first counter circuit for presetting the count in said first counter circuit, and
      (4) means for resetting the output of said first flip-flop to its second state and for resetting said first counter circuit to said preset count when said first counter circuit reaches a predetermined count, said output pulse being initiated by the output of said first flip-flop going to said first state and terminated by the output of said first flip-flop going to said second state from said first state, the width of said pulse being determined by the preset count in said first counter circuit; and
   c. means for generating a series of said first control pulses with the period between said first control pulses being selectable including,
      (1) a second counter circuit coupled to said means for generating a clock signal for counting in response to said clock signal, said second counter circuit generating said first control pulse when the count in said second counter circuit reaches a predetermined count, and
      (2) means responsive to said clock signal and to said first control pulse for presetting the count in said second counter circuit.

2. Apparatus as recited in claim 1 wherein said means responsive to a first control pulse further includes a one-shot having its trigger input coupled for receiving said first control pulse and its output coupled to said first flip-flop.

3. Apparatus as recited in claim 1 wherein said means for presetting the count in said first counter circuit includes a plurality of thumb wheel switches.

4. Apparatus as recited in claim 1 wherein said means responsive to said clock signal and to said first control pulse for presetting the count in said second counter includes:
   a. a memory circuit;
   b. at least one data storage circuit coupled between said second counter circuit and said memory circuit for storing data read-out of said memory circuit;
   c. means coupled to said memory circuit for sequentially addressing said memory circuit; and
   d. control means communicating with each said data storage circuit and said means for addressing, said control means incrementing said means for addressing and then loading of the contents of the addressed memory location into one data storage circuit until all said data storage circuits are filled with each said data storage circuit being loaded with data from a different memory address location, said control means further including means for loading the contents of said at least one data storage circuit in said second counter circuit.

5. Apparatus as recited in claim 4 wherein said control means includes:
   a. a second flip-flop coupled to receive said first control pulse, said flip-flop output going high upon the receipt of said first control pulse;
   b. a third counter circuit coupled to receive said clock signal and said output of said second flip-flop, said third counter circuit having a plurality of outputs as well as a carry output, each said even numbered output being coupled to a respective data storage circuit, said carry output being coupled to said second flip-flop for resetting said second flip-flop when said third counter circuit fills, said third counter circuit being enabled when said second flip-flop output goes high and disabled when said second flip-flop output goes low; and c. an OR gate coupled between each odd numbered output from said third counter circuit and said means for addressing, so that when an odd number output goes high said means for addressing is incremented.

6. Apparatus as recited in claim 4 or 5 wherein said means for sequentially addressing said memory circuit includes a fourth counter circuit having its output coupled to said memory circuit for addressing said memory circuit.

7. Apparatus as recited in claim 6 further comprising:

a. comparator means for comparing a first set of input signals with a second set of input signals and for providing an output signal when said first set of input signals is identical to said second set of input signals, the outputs of said fourth counter circuit being coupled to said comparator means as said first set of input signals;

b. thumb wheel switch means coupled to said comparator means for providing said second set of input signals; and c. the output of said comparator means being coupled to said fourth counter circuit to reset said fourth counter circuit when the output of said fourth counter circuit is identical to the output of said thumb wheel switch means.

8. The apparatus of claim 6 further including an error detection circuit coupled between said memory addressing means and said control means, said error detection circuit resetting said memory addressing means when an error exists in said control means or in said memory addressing means.

9. The apparatus of claim 8 wherein said error detection circuit includes an exclusive OR circuit.

* * * * *